(12) United States Patent
Sun et al.

(10) Patent No.: US 9,431,116 B2
(45) Date of Patent: Aug. 30, 2016

(54) CONFIGURATION PARAMETER MANAGEMENT USING A CONFIGURATION TOOL

(71) Applicant: SanDisk Technologies, Inc., Plano, TX (US)

(72) Inventors: Hairong Sun, Superior, CO (US); Jea Hyun, Los Altos, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/601,226

(22) Filed: Jan. 20, 2015

(65) Prior Publication Data

US 2016/0141044 A1    May 19, 2016

Related U.S. Application Data

(60) Provisional application No. 62/081,683, filed on Nov. 19, 2014.

(51) Int. Cl.

| G11C 16/04 | (2006.01) |
|---|---|
| G11C 16/20 | (2006.01) |
| G11C 16/26 | (2006.01) |
| G11C 16/10 | (2006.01) |
| G11C 16/34 | (2006.01) |

(52) U.S. Cl.
CPC .............. G11C 16/20 (2013.01); G11C 16/10 (2013.01); G11C 16/26 (2013.01); *G11C 16/3418* (2013.01)

(58) Field of Classification Search
CPC ....... G11C 16/20; G11C 16/26; G11C 16/10; G11C 16/3418

USPC ............................ 365/185.11, 185.02, 185.24
See application file for complete search history.

(56) References Cited

U.S. PATENT DOCUMENTS

| 7,181,370 | B2 * | 2/2007 | Furem ..................... E02F 9/205 |
| | | | 701/50 |
| 7,542,344 | B2 * | 6/2009 | Kim ..................... G11C 11/5628 |
| | | | 365/185.03 |
| 7,889,563 | B2 | 2/2011 | Cho et al. |
| 8,000,135 | B1 | 8/2011 | Perlmutter et al. |
| 8,040,737 | B2 | 10/2011 | Alrod et al. |
| 8,073,648 | B2 | 12/2011 | Shlick et al. |
| 8,259,506 | B1 | 9/2012 | Sommer et al. |
| 8,380,915 | B2 | 2/2013 | Wood et al. |
| 8,593,866 | B2 * | 11/2013 | Hutchison .......... G11C 11/5628 |
| | | | 365/185.09 |

(Continued)

FOREIGN PATENT DOCUMENTS

| WO | 2008117921 | 10/2008 |
| WO | 2009015313 | 1/2009 |

*Primary Examiner* — Pho M Luu
(74) *Attorney, Agent, or Firm* — Kunzler Law Group, PC

(57) ABSTRACT

Apparatuses, systems, and methods are disclosed for managing configuration parameters for non-volatile data storage. An initialization module is configured to initialize a value for a configuration parameter for a set of cells of a non-volatile memory medium. The initialization module may initialize the configuration parameter value based on a predetermined model for the set of cells. An update module is configured to adjust the configuration parameter using an existing function of the non-volatile memory medium. The existing function may use the initialized value to adjust the configuration parameter. The update module may adjust the configuration parameter in response to a trigger. An access module is configured to access the set of storage cells using the adjusted configuration parameter.

23 Claims, 8 Drawing Sheets

(56) References Cited

U.S. PATENT DOCUMENTS

| | | |
|---|---|---|
| 8,661,184 B2 | 2/2014 | Wood et al. |
| 8,750,050 B2 * | 6/2014 | Kamano ............ G11C 16/0425 365/185.22 |
| 8,773,922 B2 * | 7/2014 | Song ................... G11C 11/5642 365/189.07 |
| 9,036,415 B2 * | 5/2015 | Sharon ................ G06F 11/1072 365/185.01 |
| 2008/0019182 A1 | 1/2008 | Yanagidaira et al. |
| 2012/0268994 A1 | 10/2012 | Nagashima |
| 2014/0198567 A1 | 7/2014 | Mokhlesi |

\* cited by examiner

CONFIGURATION PARAMETER MANAGEMENT USING A CONFIGURATION TOOL

CROSS-REFERENCES TO RELATED APPLICATIONS

This application claims the benefit of U.S. Provisional Patent Application No. 62/081,683 entitled "CONFIGURATION PARAMETER MANAGEMENT USING A CONFIGURATION TOOL" and filed on Nov. 19, 2014, for Hairong Sun, et al., which is incorporated herein by reference.

TECHNICAL FIELD

The present disclosure, in various embodiments, relates to data storage and more particularly relates to configuration parameters for non-volatile media.

BACKGROUND

Several types of data storage devices, such as flash memory devices, store data in cells of non-volatile media. A physical property of each cell, such as a stored charge, voltage, material phase, electrical resistance, magnetization, or the like, is alterable to encode data. A cell's physical property may be variable across a range, which may be divided into discrete states, so that different states correspond to different data values. Sensing whether the cell's physical property satisfies one or more read thresholds (e.g., voltage thresholds, resistivity thresholds, or the like) within its range determines the cell's state, thus allowing recovery of a stored data value.

The data-encoding physical property of a cell may vary over time due to cell damage, charge leakage, temperature effects, disturbances from nearby cells, or the like. An error may occur if the cell moves from one state into an adjacent state. As storage density increases, feature size shrinks, making the cells more susceptible to such disturbances. Appropriate management of read thresholds and various other configuration parameters may reduce error rates by compensating for such disturbances.

SUMMARY

Methods are presented for managing configuration parameters for non-volatile data storage. In one embodiment, a method includes overwriting a default value for an integrated update function of a non-volatile storage medium with an initial value for a configuration parameter for a group of storage cells of a non-volatile storage medium. In a further embodiment, an initial value for a configuration parameter may be based on one or more characteristics for a group of storage cells. In a certain embodiment, a method includes updating an initial value for a configuration parameter using an integrated update function of a non-volatile storage medium. In a further embodiment, a method includes accessing a group of storage cells using an updated value for a configuration parameter.

Apparatuses are presented for managing configuration parameters for non-volatile data storage. In one embodiment, an initialization module is configured to initialize a value for a configuration parameter for a set of cells of a non-volatile memory medium. In a further embodiment, an initialization module may initialize a configuration parameter value based on a predetermined model for a set of cells. In a certain embodiment, an update module is configured to adjust a configuration parameter using an existing function of a non-volatile memory medium. In a further embodiment, an existing function may use an initialized value to adjust a configuration parameter. In some embodiments, an update module may adjust a configuration parameter in response to a trigger. In one embodiment, an access module is configured to access a set of storage cells using an adjusted configuration parameter.

An apparatus, in another embodiment, includes a trigger module configured to determine that a trigger has occurred for a region of a non-volatile storage medium. In a certain embodiment, an update module is configured to determine a read voltage threshold using a read voltage search function of a non-volatile storage medium in response to a trigger. In a further embodiment, an access module is configured to access a region of a non-volatile storage medium using a determined read voltage threshold.

Systems are presented for managing configuration parameters for non-volatile data storage. A system, in one embodiment, includes a non-volatile recording device and a controller for the non-volatile recording device. In certain embodiments, a non-volatile recording device includes a non-volatile recording medium. In one embodiment, a controller establishes an initial read voltage threshold for an erase block of a non-volatile recording medium. In a further embodiment, a controller establishes an initial read voltage threshold based on one or more characteristics for an erase block. In a certain embodiment, a controller sets a read voltage threshold by triggering a configuration tool of a non-volatile recording medium. In a further embodiment, a controller triggers a configuration tool in response to a threshold being satisfied. In some embodiments, a controller accesses an erase block using a set read voltage threshold.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1:
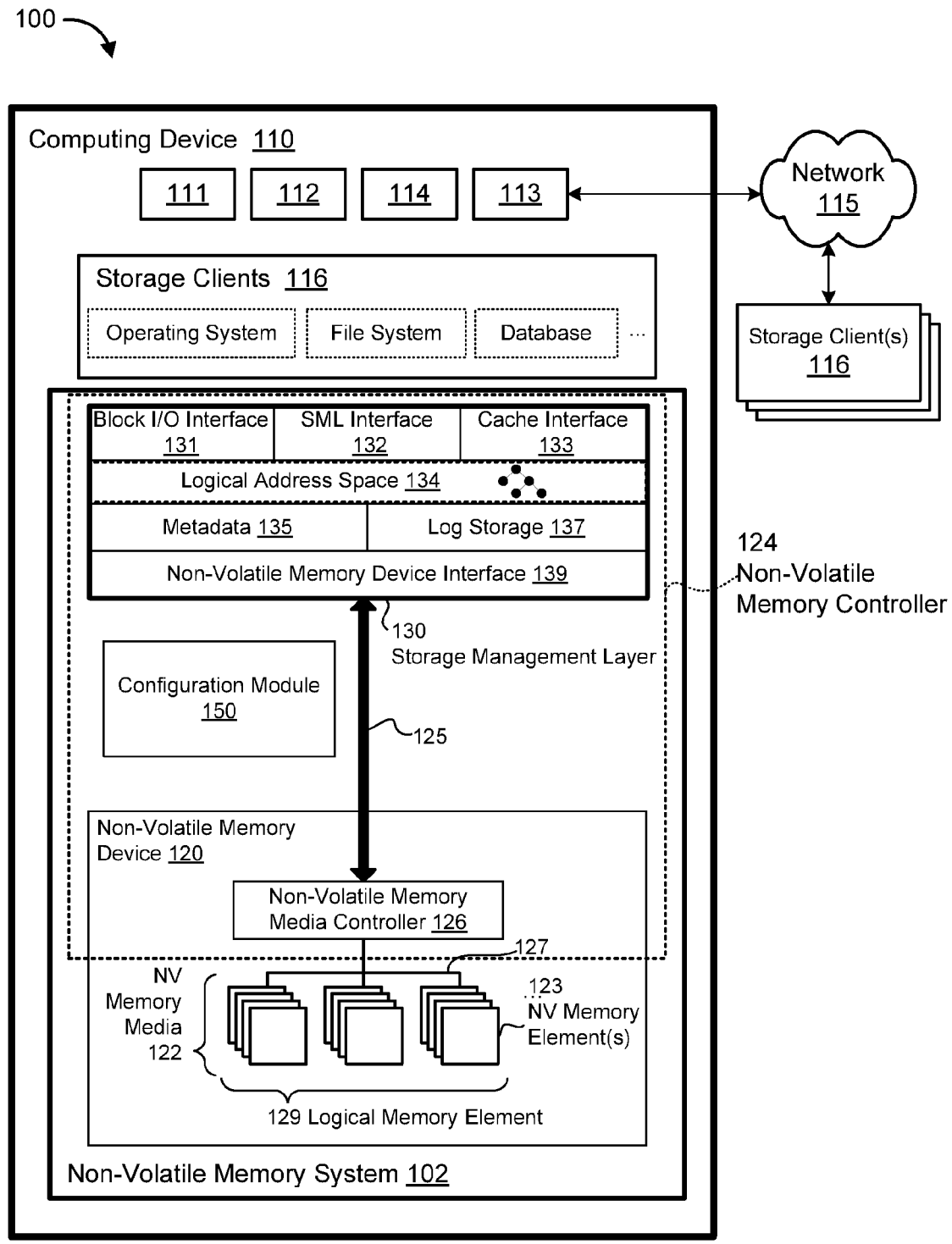
FIG. 1 is a schematic block diagram illustrating one embodiment of a system comprising a configuration module.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1 is a block diagram of one embodiment of a system 100 comprising a configuration module 150. The configuration module 150 may be part of and/or in communication with one or more of a non-volatile memory controller 124, a non-volatile memory media controller 126, a device driver or storage management layer (SML) 130, or the like. The configuration module 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 124 to a communication network 115, such as an Internet Protocol network, a Storage Area Network, or the like.

The computing device 110 may further comprise a non-transitory, computer readable storage media 114. The computer readable storage media 114 may comprise executable instructions configured to cause the computing device 110 (e.g., processor 111) to perform steps of one or more of the methods disclosed herein. Alternatively, or in addition, the configuration module 150 may be embodied as one or more computer readable instructions stored on the non-transitory storage media 114.

Some non-volatile media controllers may manage configuration parameters by selecting a configuration parameter value from a lookup table of configuration parameter values for various storage characteristics. For example, a lookup table may store different configuration parameter values for different program/erase cycle counts, different retention times, or the like. However, it may be resource-intensive to determine various storage characteristics, update and maintain a lookup table, and send configuration parameter values to non-volatile media elements.

Certain types of non-volatile media 122 may provide integrated configuration tools. Various integrated configuration tools may adjust configuration parameters by sweeping in a narrow range around an existing configuration parameter. However, although the adjusted configuration parameter value from an integrated configuration tool may be an improvement within the narrow range, there may be a better value for the configuration parameter outside the narrow range, or an optimal configuration parameter value may be so far from a default value where the search begins, that unnecessary delay is introduced.

The non-volatile memory system 102, in the depicted embodiment, includes a configuration module 150. The configuration module 150, in one embodiment, is configured to set an initial configuration parameter for a group of storage cells of a non-volatile memory medium 122, based on one or more characteristics for the group of cells, update the configuration parameter using an integrated update function of the non-volatile memory medium 122, access the group of storage cells using the updated configuration parameter, or the like. Setting the initial configuration parameter based on characteristics of the group of cells may provide a useful search range for the integrated update function, so that the updated configuration parameter is appropriate, given the characteristics of the group of cells.

In one embodiment, the configuration module 150 may comprise executable software code, such as a device driver, SML 130, or the like, stored on the computer readable storage media 114 for execution on the processor 111. In another embodiment the configuration module 150 may comprise logic hardware of one or more non-volatile memory devices 120, such as a non-volatile memory media controller 126, a non-volatile memory controller 124, a device controller, a field-programmable gate array (FPGA) or other programmable logic, firmware for an FPGA or other programmable logic, microcode for execution on a microcontroller, an application-specific integrated circuit (ASIC), or the like. In a further embodiment, the configuration module 150 may include a combination of both executable software code and logic hardware. The configuration module 150 is described in greater detail below with regard to FIGS. 4 and 5.

According to various embodiments, a non-volatile memory controller 124 comprising the configuration module 150 may manage one or more non-volatile memory devices 120. The non-volatile memory device(s) 120 may comprise recording, memory, and/or storage devices, such as solid-state storage device(s), that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, erase blocks, sectors, blocks, collections or sets of physical storage locations (e.g., logical pages, logical erase blocks, described below), or the like.

The non-volatile memory controller 124 may comprise an SML 130, which may present a logical address space 134 to one or more storage clients 116. One example of an SML is the Virtual Storage Layer® of SanDisk Corporation of Milpitas, Calif. Alternatively, each non-volatile memory device 120 may comprise a non-volatile memory media controller 126, which may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

The SML 130 may maintain metadata 135, such as a forward index, to map logical addresses of the logical address space 134 to media storage locations on the non-volatile memory device(s) 120. The SML 130 may provide for arbitrary, any-to-any mappings from logical addresses to physical storage resources. As used herein, an "any-to any" mapping may map any logical address to any physical storage resource. Accordingly, there may be no pre-defined and/or pre-set mappings between logical addresses and particular, media storage locations and/or media addresses. As used herein, a media address refers to an address of a memory resource that uniquely identifies one memory resource from another to a controller that manages a plurality of memory resources. By way of example, a media address includes, but is not limited to: the address of a media storage location, a physical memory unit, a collection of physical memory units (e.g., a logical memory unit), a portion of a memory unit (e.g., a logical memory unit address and offset, range, and/or extent), or the like. Accordingly, the SML 130 may map logical addresses to physical data resources of any size and/or granularity, which may or may not correspond to the underlying data partitioning scheme of the non-volatile memory device(s) 120. For example, in some embodiments, the non-volatile memory controller 124 is configured to store data within logical memory units that are formed by logically combining a plurality of physical memory units, which may allow the non-volatile memory controller 124 to support many different virtual memory unit sizes and/or granularities.

As used herein, a logical memory element refers to a set of two or more non-volatile memory elements that are or are capable of being managed in parallel (e.g., via an I/O and/or control bus). A logical memory element may comprise a plurality of logical memory units, such as logical pages, logical memory divisions (e.g., logical erase blocks), and so on. As used herein, a logical memory unit refers to a logical construct combining two or more physical memory units, each physical memory unit on a respective non-volatile memory element in the respective logical memory element (e.g., each non-volatile memory element being accessible in parallel). As used herein, a logical memory division refers to a set of two or more physical memory divisions, each physical memory division on a respective non-volatile memory element in the respective logical memory element.

The logical address space 134 presented by the SML 130 may have a logical capacity, which may correspond to the number of available logical addresses in the logical address space 134 and the size and/or granularity of the data referenced by the logical addresses. For example, the logical capacity of a logical address space 134 comprising $2^{32}$ unique logical addresses, each referencing 2048 bytes (2 KiB) of data may be $2^{43}$ bytes. As used herein, a kibibyte (KiB) refers to 1024 bytes. In some embodiments, the logical address space 134 may be thinly provisioned. As used herein, a "thinly provisioned" logical address space 134 refers to a logical address space 134 having a logical capacity that exceeds the physical capacity of the underlying non-volatile memory device(s) 120. For example, the SML 130 may present a 64-bit logical address space 134 to the storage clients 116 (e.g., a logical address space 134 referenced by 64-bit logical addresses), which may exceed the physical capacity of the underlying non-volatile memory devices 120. The large logical address space 134 may allow storage clients 116 to allocate and/or reference contiguous ranges of logical addresses, while reducing the chance of naming conflicts. The SML 130 may leverage the any-to-any mappings between logical addresses and physical storage resources to manage the logical address space 134 independently of the underlying physical storage devices 120. For example, the SML 130 may add and/or remove physical storage resources seamlessly, as needed, and without changing the logical addresses used by the storage clients 116.

The non-volatile memory controller 124 may be configured to store data in a contextual format. As used herein, a contextual format refers to a self-describing data format in which persistent contextual metadata is stored with the data on the physical storage media 122. The persistent contextual metadata provides context for the data with which it is stored. In certain embodiments, the persistent contextual metadata uniquely identifies the data with which the persistent contextual metadata is stored. For example, the persistent contextual metadata may uniquely identify a sector or block of data owned by a storage client 116 from other sectors or blocks of data owned by the storage client 116. In a further embodiment, the persistent contextual metadata identifies an operation that is performed on the data. In a further embodiment, the persistent contextual metadata identifies a sequence of operations performed on the data. In a further embodiment, the persistent contextual metadata identifies security controls, a data type, or other attributes of the data. In a certain embodiment, the persistent contextual metadata identifies at least one of a plurality of aspects, including data type, a unique data identifier, an operation, and a sequence of operations performed on the data.

The persistent contextual metadata may include, but is not limited to: a logical address of the data, an identifier of the data (e.g., a file name, object id, label, unique identifier, or the like), reference(s) to other data (e.g., an indicator that the data is associated with other data), a relative position or offset of the data with respect to other data (e.g., file offset, etc.), data size and/or range, and the like. The contextual data format may comprise a packet format comprising a data segment and one or more headers. Alternatively, a contextual data format may associate data with context information in other ways (e.g., in a dedicated index on the non-volatile memory media 122, a memory division index, or the like).

In some embodiments, the contextual data format may allow data context to be determined and/or reconstructed based upon the contents of the non-volatile memory media 122, and independently of other metadata, such as the arbitrary, any-to-any mappings discussed above. Since the media location of data is independent of the logical address of the data, it may be inefficient or impossible to determine the context of data based solely upon the media location or media address of the data. Storing data in a contextual format on the non-volatile memory media 122 may allow data context to be determined without reference to other metadata. For example, the contextual data format may allow the metadata to be reconstructed based only upon the contents of the non-volatile memory media 122 (e.g., reconstruct the any-to-any mappings between logical addresses and media locations).

In some embodiments, the non-volatile memory controller 124 may be configured to store data on one or more asymmetric, write-once media 122, such as solid-state storage media. As used herein, a "write once" storage medium refers to a storage medium that is reinitialized (e.g., erased) each time new data is written or programmed thereon. As used herein, an "asymmetric" storage medium refers to a storage medium 122 having different latencies for different storage operations. Many types of solid-state storage media are asymmetric; for example, a read operation may be much faster than a write/program operation, and a write/program operation may be much faster than an erase operation (e.g., reading the media may be hundreds of times faster than erasing, and tens of times faster than programming the media).

The memory media 122 may be partitioned into memory divisions that can be erased as a group (e.g., erase blocks) in order to, inter alia, account for the asymmetric properties of the media 122 or the like. As such, modifying a single data segment in-place may require erasing the entire erase block comprising the data, and rewriting the modified data to the erase block, along with the original, unchanged data. This may result in inefficient "write amplification," which may excessively wear the media 122. Therefore, in some embodiments, the non-volatile memory controller 124 may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. Moreover, writing data out-of-place may remove erasure from the latency path of many storage operations (e.g., the erasure latency is no longer part of the critical path of a write operation).

The non-volatile memory controller 124 may comprise one or more processes that operate outside of the regular path for servicing of storage operations (e.g., the "path" for performing a storage operation and/or servicing a storage request). As used herein, the "path for servicing a storage request" or "path for servicing a storage operation" (also referred to as the "critical path") refers to a series of processing operations needed to service the storage operation or request, such as a read, write, modify, or the like. The path for servicing a storage request may comprise receiving the request from a storage client 116, identifying the logical addresses of the request, performing one or more storage operations on non-volatile memory media 122, and returning a result, such as acknowledgement or data. Processes that occur outside of the path for servicing storage requests may include, but are not limited to: a groomer, de-duplication, and so on. These processes may be implemented autonomously and in the background, so that they do not interfere with or impact the performance of other storage operations and/or requests. Accordingly, these processes may operate independent of servicing storage requests.

In some embodiments, the non-volatile memory controller 124 comprises a groomer, which is configured to reclaim memory divisions (e.g., logical or physical erase blocks) for reuse, using a garbage collection or other storage capacity recovery process. The write out-of-place paradigm implemented by the non-volatile memory controller 124 may result in obsolete or invalid data remaining on the non-volatile memory media 122. For example, overwriting data X with data Y may result in storing Y on a new memory division (e.g., rather than overwriting X in place), and updating the any-to-any mappings of the metadata to identify Y as the valid, up-to-date version of the data. The obsolete version of the data X may be marked as invalid, but may not be immediately removed (e.g., erased), since, as discussed above, erasing X may involve erasing an entire memory division, which is a time-consuming operation and may result in write amplification. Similarly, data that is no longer is use (e.g., deleted or trimmed data) may not be immediately removed. The non-volatile memory media 122 may accumulate a significant amount of invalid data.

A groomer process may operate outside of the critical path for servicing storage operations. The groomer process may reclaim memory divisions so that they can be reused for other storage operations. As used herein, reclaiming a memory division refers to erasing the memory division so that new data may be stored/programmed thereon. Reclaiming a memory division may comprise relocating valid data on the memory division to a new location. The groomer may identify memory divisions for reclamation based upon one or more factors, which may include, but are not limited to: the amount of invalid data in the memory division, the amount of valid data in the memory division, wear on the memory division (e.g., number of erase cycles), time since the memory division was programmed or refreshed, and so on.

The non-volatile memory controller 124 may be further configured to store data in a log format. As described above, a log format refers to a data format that defines an ordered sequence of storage operations performed on a non-volatile memory media 122. In some embodiments, the log format comprises storing data in a pre-determined sequence of media addresses of the non-volatile memory media 122 (e.g., within sequential pages and/or erase blocks of the media 122). The log format may further comprise associating data (e.g., each packet or data segment) with respective sequence indicators. The sequence indicators may be applied to data individually (e.g., applied to each data packet) and/or to data groupings (e.g., packets stored sequentially on a memory division, such as an erase block). In some embodiments, sequence indicators may be applied to memory divisions when the memory divisions are reclaimed (e.g., erased), as described above, and/or when the memory divisions are first used to store data.

In some embodiments the log format may comprise storing data in an "append only" paradigm. The non-volatile memory controller 124, using the log storage module 137 described below or the like, may maintain a current append point at a media address of the non-volatile memory device 120. The append point may be a current memory division and/or offset within a memory division. Data may then be sequentially appended from the append point. The sequential ordering of the data, therefore, may be determined based upon the sequence indicator of the memory division of the data in combination with the sequence of the data within the memory division. Upon reaching the end of a memory division, the non-volatile memory controller 124 may identify the "next" available memory division (e.g., the next memory division that is initialized and ready to store data). The groomer may reclaim memory divisions comprising invalid, stale, and/or deleted data, to ensure that data may continue to be appended to the media log.

The log format described herein may allow valid data to be distinguished from invalid data based upon the contents of the non-volatile memory media 122, and independently of other metadata. As discussed above, invalid data may not be removed from the non-volatile memory media 122 until the memory division comprising the data is reclaimed. Therefore, multiple "versions" of data having the same context may exist on the non-volatile memory media 122 (e.g., multiple versions of data having the same logical addresses). The sequence indicators associated with the data may be used to distinguish invalid versions of data from the current, up-to-date version of the data; the data that is the most recent in the log is the current version, and previous versions may be identified as invalid.

The storage management layer 130 may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

The storage management layer 130 comprises and/or is communicatively coupled to one or more non-volatile memory devices 120. The one or more non-volatile memory devices 120 may include different types of non-volatile memory devices including, but not limited to: solid-state storage devices, hard drives, SAN storage resources, or the like. The one or more non-volatile memory devices 120 may comprise one or more respective non-volatile memory media controllers 126 and non-volatile memory media 122. As illustrated in FIG. 1, The SML 130 may provide access to the one or more non-volatile memory devices 120 via a traditional block I/O interface 131. Additionally, the SML 130 may provide access to enhanced functionality (e.g., a large, virtual address space 134) through the SML interface 132. The metadata 135 may be used to manage and/or track storage operations performed through any of the Block I/O interface 131, SML interface 132, cache interface 133, or other, related interfaces.

The cache interface 133 may expose cache-specific features accessible via the storage management layer 130. Also, in some embodiments, the SML interface 132 presented to the storage clients 116 provides access to data transformations implemented by the one or more non-volatile memory devices 120 and/or the one or more non-volatile memory media controllers 126.

The SML 130 may provide storage services through one or more interfaces, which may include, but are not limited to: a block I/O interface, an extended storage management layer interface, a cache interface, and the like. The SML 130 may present a logical address space 134 to the storage clients 116 through one or more interfaces. As discussed above, the logical address space 134 may comprise a plurality of logical addresses, each corresponding to respective media locations the on one or more non-volatile memory devices 120. The SML 130 may maintain metadata 135 comprising any-to-any mappings between logical addresses and media locations, as described above.

The SML 130 may further comprise a log storage module 137 that is configured to store data in a contextual, log format. The contextual, log data format may comprise associating data with persistent contextual metadata, such as the logical address of the data, or the like. The contextual, log format may further comprise associating data with respective sequence identifiers on the non-volatile memory media 122, which define an ordered sequence of storage operations performed on the one or more non-volatile memory devices 120, as described above.

The SML 130 may further comprise a non-volatile memory device interface 139 configured to transfer data, commands, and/or queries to the one or more non-volatile memory devices 120 over a bus 125, which may include, but is not limited to: a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 124 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 124 comprises one or more non-volatile memory devices 120. Although FIG. 1 depicts a single non-volatile memory device 120, the disclosure is not limited in this regard and could be adapted to incorporate any number of non-volatile memory devices 120.

The non-volatile memory device 120 may comprise non-volatile memory media 122, which may include but is not limited to: NAND flash memory, NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), resistive RAM (RRAM), programmable metallization cell (PMC), conductive-bridging RAM (CBRAM), magneto-resistive RAM (MRAM), dynamic RAM (DRAM), phase change RAM (PRAM or PCM), magnetic storage media (e.g., hard disk, tape), optical storage media, or the like. While the non-volatile memory media 122 is referred to herein as "memory media," in various embodiments, the non-volatile memory media 122 may more generally comprise a non-volatile recording media capable of recording data, which may be referred to as a non-volatile memory media, a non-volatile storage media, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, and the like. A non-volatile memory media controller 126 may be configured to manage storage operations on the non-volatile memory media 122, and may comprise one or more processors, programmable processors (e.g., field-programmable gate arrays), or the like. In some embodiments, the non-volatile memory media controller 126 is configured to store data on and/or read data from the non-volatile memory media 122 in the contextual, log format described above, and to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. As discussed above, the logical memory element may be partitioned into respective logical memory units (e.g., logical pages) and/or logical memory divisions (e.g., logical erase blocks). The logical memory units may be formed by logically combining physical memory units of each of the non-volatile memory elements. For example, if the non-volatile memory media 122 comprises twenty-five (25) non-volatile memory elements, each logical memory unit may comprise twenty-five (25) pages (e.g., a page of each element of non-volatile memory media 122).

The non-volatile memory controller 124 may comprise an SML 130 and the non-volatile memory media controller 126. The SML 130 may provide storage services to the storage clients 116 via one or more interfaces 131, 132, and/or 133. In some embodiments, the SML 130 provides a block-device I/O interface 131 through which storage clients 116 perform block-level I/O operations. Alternatively, or in addition, the SML 130 may provide a storage management layer (SML) interface 132, which may provide other storage services to the storage clients 116. In some embodiments, the SML interface 132 may comprise extensions to the block device interface 131 (e.g., storage clients 116 may access the SML interface 132 through extensions to the block device interface 131). Alternatively, or in addition, the SML interface 132 may be provided as a separate API, service, and/or library. The SML 130 may be further configured to provide a cache interface 133 for caching data using the non-volatile memory system 102.

As described above, the SML 130 may present a logical address space 134 to the storage clients 116 (e.g., through the interfaces 131, 132, and/or 133). The SML 130 may maintain metadata 135 comprising any-to-any mappings between logical addresses in the logical address space 134 and media locations on the non-volatile memory device 120. The metadata 135 may comprise a logical-to-physical mapping structure with entries that map logical addresses in the logical address space 134 and media locations on the non-volatile memory device 120. The logical-to-physical mapping structure of the metadata 135, in one embodiment, is sparsely populated, with entries for logical addresses for which the non-volatile memory device 120 stores data and with no entries for logical addresses for which the non-volatile memory device 120 does not currently store data. The metadata 135, in certain embodiments, tracks data at a block level, with the SML 130 managing data as blocks.

The non-volatile memory system 102 may further comprise a log storage module 137, which, as described above, may be configured to store data on the non-volatile memory device 120 in a contextual, log format. The contextual, log data format may comprise associating data with a logical address on the non-volatile memory media 122. The contextual, log format may further comprise associating data with respective sequence identifiers on the non-volatile memory media 122, which define an ordered sequence of storage operations performed on the non-volatile memory media 122, as described above. The non-volatile memory controller 124 may further comprise a non-volatile memory device interface 139 that is configured to transfer data, commands, and/or queries to the non-volatile memory media controller 126 over a bus 125, as described above.

Figure 2:
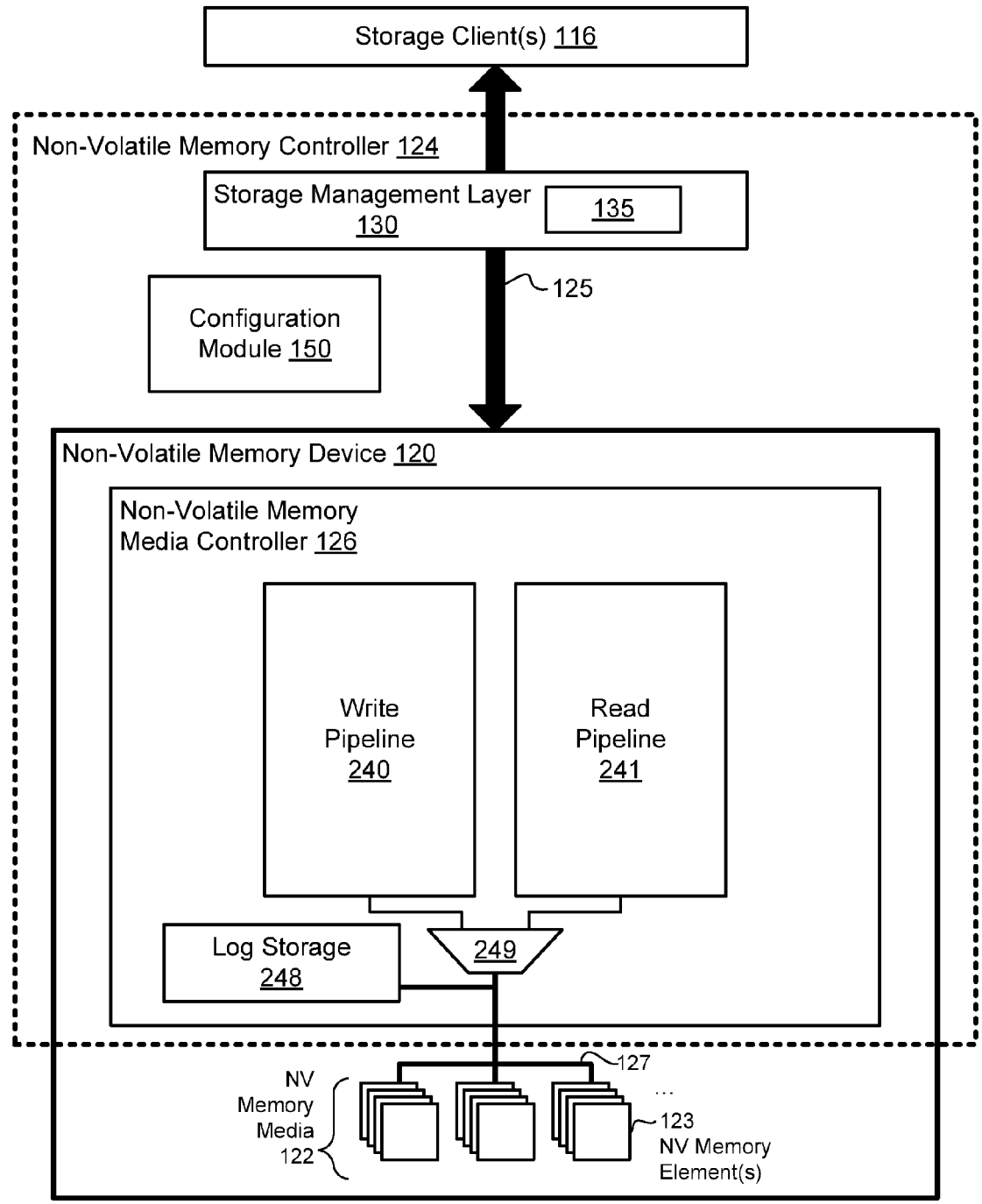
FIG. 2 is a schematic block diagram illustrating a further embodiment of a system comprising a configuration module.

FIG. 2 depicts another embodiment of a non-volatile memory controller 124 configured to manage configuration parameters. The non-volatile memory device 120 may comprise a non-volatile memory media controller 126 and non-volatile memory media 122. The non-volatile memory media 122 may comprise a plurality of non-volatile memory elements 123, which may be communicatively coupled to the non-volatile memory media controller 126 via a bus 127, as described above.

The non-volatile memory media controller 126 may comprise a write pipeline 240 that is configured to store data on the non-volatile memory media 122 in a contextual format in response to requests received via the bus 125. The requests may include and/or reference data to be stored on the non-volatile memory media 122, may include logical address(es) of the data, and so on. As described above, the contextual format may comprise storing a logical address of the data in association with the data on the non-volatile memory media 122. For example, the write pipeline 240 may be configured to format data into packets, and may include the logical address of the data in a packet header or other packet field. The write pipeline 240 may be configured to buffer data for storage on the non-volatile memory media 122. In some embodiments, the write pipeline 240 may comprise one or more synchronization buffers to synchronize a clock domain of the non-volatile memory media controller 126 with a clock domain of the non-volatile memory media 122 and/or bus 127.

The log storage module 248 may be configured to select media location(s) for the data and may provide addressing and/or control information to the non-volatile memory elements 123 via the bus 127. In some embodiments, the log storage module 248 is configured to store data sequentially in a log format within the non-volatile memory media. The log storage module 248 may be further configured to groom the non-volatile memory media, as described above. In certain embodiments the log storage module 248 is substantially similar to the log storage module 137 as described above. The log storage module 248 may be executed by the SML 130 and/or by the non-volatile memory media controller 126.

Upon writing data to the non-volatile memory media, the non-volatile memory media controller 126 may be configured to update metadata 135 (e.g., a forward index) to associate the logical address(es) of the data with the media address(es) of the data on the non-volatile memory media 122. In some embodiments, the metadata 135 may be maintained on the non-volatile memory media controller 126; for example, the metadata 135 may be stored on the non-volatile memory media 122, on a volatile memory (not shown), or the like. Alternatively, or in addition, the metadata 135 may be maintained within the SML 130 (e.g., on a volatile memory 112 of the computing device 110 of FIG. 1). In some embodiments, the metadata 135 may be maintained in a volatile memory by the SML 130, and may be periodically stored on the non-volatile memory media 122.

The non-volatile memory media controller 126 may further comprise a read pipeline 241 that is configured to read contextual data from the non-volatile memory media 122 in response to requests received via the bus 125. The requests may comprise a logical address of the requested data, a media address of the requested data, and so on. The read pipeline 241 may be configured to read data stored in a contextual format from the non-volatile memory media 122 and to provide the data to the SML 130 and/or a storage client 116. The read pipeline 241 may be configured to determine the media address of the data using a logical address of the data and the metadata 135. Alternatively, or in addition, the SML 130 may determine the media address of the data and may include the media address in the request. The log storage module 248 may provide the media address to the non-volatile memory elements 123, and the data may stream into the read pipeline 241 via a buffer. The read pipeline 241 may comprise one or more read synchronization buffers for clock domain synchronization, as described above.

The non-volatile memory media controller 126 may further comprise a multiplexer 249 that is configured to selectively route data and/or commands to/from the write pipeline 240 and the read pipeline 241. In some embodiments, non-volatile memory media controller 126 may be configured to read data while filling a buffer of the write pipeline 240 and/or may interleave one or more storage operations on one or more banks of non-volatile memory elements 123 (not shown).

Figure 3:
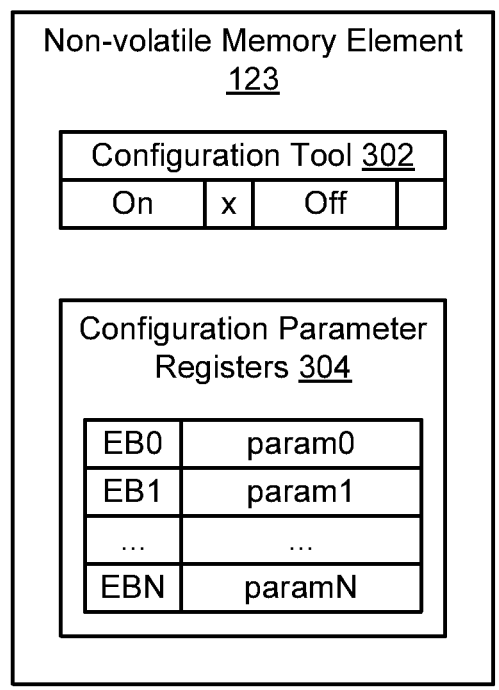
FIG. 3 is a schematic block diagram illustrating one embodiment of a non-volatile memory element with an integrated configuration tool.

FIG. 3 depicts one embodiment of a non-volatile memory element 123. The non-volatile memory element 123 may be substantially similar to the non-volatile memory element 123 described above with regard to FIG. 1. In general, as described above, a non-volatile memory element 123 may refer to a chip, package, plane, die, die plane, integrated circuit device, or the like, and a non-volatile memory medium 122 may comprise one or more non-volatile memory elements 123. In the depicted embodiment, the non-volatile memory element 123 includes a configuration tool 302 and one or more configuration parameter registers 304.

The configuration tool 302, in one embodiment, may be triggered to set, update, determine, or adjust a configuration parameter, such as a read voltage threshold. In various embodiments, the configuration tool 302 may use an integrated update function, a read voltage search function, or another existing function of the non-volatile storage element 123 or medium 122, to search for an updated or adjusted value for a configuration parameter. In one embodiment, the configuration tool 302 may use an existing or initialized value for a configuration parameter to update the configuration parameter. For example, in a certain embodiment, the configuration tool 302 may search within a range associated with the initial or existing configuration parameter. In a further embodiment, the configuration tool 302 may search within a range by generating multiple different configuration parameter values within the range, accessing or attempting to access a group of storage cells multiple times using the different configuration parameters, and selecting an adjusted configuration parameter that facilitates accessing the group of cells (e.g., by lowering an error rate, equalizing a number of errors that change zeros to ones with a number of errors that change ones to zeros, or the like). In various embodiments, various configuration tools 302 may include Auto Read Calibration, Soft Data Pre-Conditioning, or the like, as provided by various vendors of non-volatile memory elements 123.

In the depicted embodiment, the configuration tool 302 may be turned on or off. In one embodiment, turning a configuration tool 302 on may cause it to begin updating or adjusting configuration parameters for various groups of cells. In another embodiment, turning a configuration tool 302 on may include enabling a mode that causes the configuration tool 302 to update or adjust a configuration parameter for a group of storage cells in response to receiving a storage request (e.g., a read or write request) for the group of storage cells. For example, in one embodiment, a controller 124 may enable a configuration tool 302, and the configuration tool 302 may run a read voltage search function to adjust a read voltage threshold for a region of the non-volatile memory medium 122, in response to receiving a read request for the region. Thus, in a further embodiment, the controller 124 could service the read request using the adjusted read voltage threshold.

In various embodiments, the non-volatile memory controller 124, storage management layer 130, non-volatile memory media controller 126, or the like may be triggered in various ways to enable or use a configuration tool 302. Triggering a configuration tool 302 is described further with regard to the trigger module 502 of FIG. 5.

In one embodiment, configuration parameter registers 304 on the non-volatile memory element 123 may store configuration parameters for different groups of storage cells. In the depicted embodiment, the configuration parameter registers 304 store a configuration parameter or set of configuration parameters for each erase block of the non-volatile memory element 123. Thus, in the depicted embodiment, param0 is a configuration parameter for erase block 0 (EB0), param1 is a configuration parameter for erase block 1 (EB1), and so on. Although one configuration parameter per erase block is shown in the depicted embodiment, in another embodiment, configuration parameter registers 304 may store a set of multiple configuration parameters per erase block, or may store configuration parameters for groups of cells other than erase blocks.

In one embodiment, the configuration parameter registers 304 may store a default configuration parameter, or another configuration parameter initialized or set via the bus 127. In another embodiment, the configuration parameter registers 304 may store an updated or adjusted configuration parameter from the configuration tool 302. In various embodiments, the configuration parameter registers 304 may be referenced by electrical circuits (e.g., integrated circuits) of the non-volatile memory medium 122 for accessing groups of storage cells (e.g., erase blocks) corresponding to the different registers 304. In some embodiments, the non-volatile memory element 123 may use or reference the values in the configuration parameter registers 304 to configure storage cells, service storage requests, or the like. For example, in one embodiment, a configuration parameter register 304 may store read voltage thresholds that separate discrete states for storage cells in an erase block, and the non-volatile memory element 123 may service a read request for the erase block by referencing the read voltage thresholds in the configuration parameter register 304 for that erase block to determine what state each cell is in, and return data values corresponding to the cells' states. In another embodiment, a configuration parameter register 304 may store a read voltage threshold offset for an erase block, and the non-volatile memory element may service storage requests by adjusting read voltage thresholds for the erase block according to the offset. Various types of configuration parameters that the configuration parameter registers 304 may store are described further below with regard to FIG. 4.

In general, using a configuration tool 302 and configuration parameter registers 304 on a non-volatile memory element 123 may reduce the resources used by the non-volatile memory media controller 126, storage management layer 130, or the like. For example, in one embodiment, a configuration tool 302 and configuration parameter registers 304 on a non-volatile memory element may allow a non-volatile memory media controller 126 to avoid using the computation cycles, memory, and bandwidth associated with determining various storage characteristics, updating and maintaining a lookup table for configuration parameters, and sending configuration parameter values to non-volatile media elements 123. In certain embodiments, a non-volatile memory media controller 126 may still use a lookup table to provide initial values for configuration parameters based on various storage characteristics, but the table may still be simplified, and the memory, computation, and bandwidth requirements of the controller for managing configuration parameters may still be reduced by using configuration tools 302 and configuration parameter registers 304 integrated with the non-volatile memory elements 123. Reducing resource requirements for a non-volatile memory media controller 126 may, in some embodiments, facilitate implementing the controller 126 using faster, application-specific hardware with small amounts of memory instead of slower, general-purpose hardware with large amounts of memory.

Figure 4:
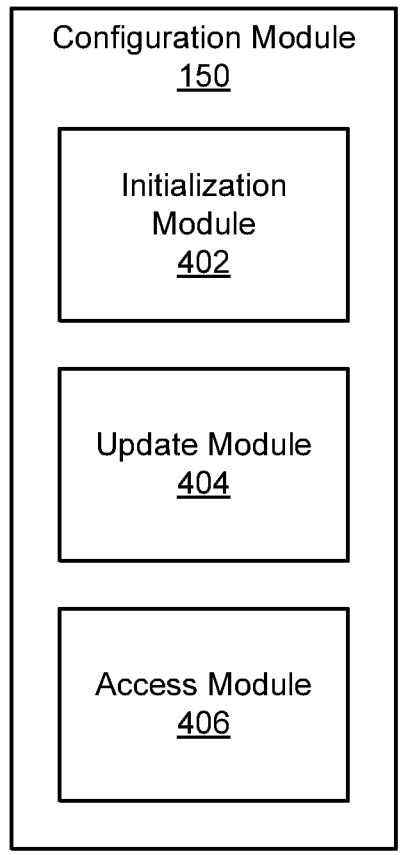
FIG. 4 is a schematic block diagram illustrating one embodiment of a configuration module.

FIG. 4 depicts one embodiment of a configuration module 150. The configuration module 150 may be substantially similar to the configuration module 150 described above with regard to FIG. 1. In general, as described above, the configuration module 150 is configured to set an initial configuration parameter for a group of storage cells of a non-volatile memory medium 122, based on one or more characteristics for the group of cells, update the configuration parameter using an integrated update function of the non-volatile memory medium 122, and access the group of storage cells using the updated configuration parameter. In the depicted embodiment, the configuration module 150 includes an initialization module 402, an update module 404, and an access module 406.

The initialization module 402, in one embodiment, is configured to set an initial configuration parameter for a group or set of storage cells of the non-volatile memory medium 122. In a certain embodiment, the initialization module 402 may initialize a value for a configuration parameter for a group or set of cells. For example, in one embodiment, the initialization module 402 may overwrite a default value for a configuration tool or integrated update function with an initial value for the configuration parameter (e.g., in a register or other predefined storage location of a non-volatile memory element 123). In a further embodiment, the initialization module 402 may establish an initial read voltage threshold for an erase block of the non-volatile memory medium 122.

In various embodiments, a means for setting an initial configuration parameter may include an initialization module 402, a configuration module 150, a non-volatile memory controller 124, a non-volatile memory media controller 126, a device driver such as an SML 130, a processor 111, other logic hardware and/or other executable code stored on a computer readable storage medium. Other embodiments may include similar or equivalent means for setting an initial configuration parameter.

As used herein, the term "cell" refers to the smallest physical unit of storage or memory of non-volatile memory media 122. In some embodiments, each cell has a physical and/or electrical property which may be altered to encode or otherwise store data. For example, in Flash memory, a cell may include a floating gate transistor, and the physical property used to encode data may be the charge stored on the floating gate, the threshold voltage that is sufficient to make the transistor conduct when applied to the control gate, or the like. As another example, in phase change memory, a cell may be a region of chalcogenide glass, and the physical property used to encode data may be the degree of crystallization of the region, the electrical resistance of the cell, or the like. As described above with regard to the non-volatile memory media 122, many types of cells may store data of a non-volatile memory device 120.

A "group," or "set" of cells, as used herein, may refer to an array of storage cells that may be treated as a single unit for reading, writing, configuration, or the like. Thus, in various embodiments, a "group," or "set" of cells may refer to a physical or logical erase block, a physical or logical page, a group of physical or logical pages or erase blocks, a word line, or the like As used herein, a "configuration parameter" for a group or set of cells, an erase block, or the like refers to any parameter that is configurable or modifiable by way of an interface. The interface may comprise a publicly known interface or a proprietary interface and may include use of particular command instructions and/or use of particular parameters, register settings, driver settings, controller settings, a particular set of command instruction sequences, or other differences from regular commands (general purpose commands) or settings used to interface with or manage the non-volatile memory media 122. Configuration parameters may relate to writing to, or programming, storage cells, reading from storage cells, erasing storage cells, managing storage cells, device driver or storage controller settings for storage cells, or the like. A configuration parameter for a group or set of cells may be associated with a device driver for the non-volatile memory device 120, a non-volatile memory controller 124, a driver or SML 130, a non-volatile memory media controller 126, or the like, and may relate to how the device driver and/or controller use, manage, and interact with the group or set of cells and/or the non-volatile memory media 122.

A configuration parameter, in certain embodiments, may refer to a threshold or a set of thresholds. In certain embodiments, various read thresholds for the data-encoding physical property of a storage cell may divide the range of possible stored values into states (e.g., the threshold values may be boundaries between discrete values stored by the storage cells). For example, in one embodiment, read voltage thresholds may divide a range of possible stored voltages into discrete states for Flash memory cells. In another embodiment, read resistance or resistivity thresholds may divide a range of possible stored resistances or resistivities into discrete states for resistive memory cells. In a further embodiment, write thresholds such as program verify thresholds or erase verify thresholds may establish guard bands near the boundaries between states (e.g., read thresholds), and the write process for a storage cell may include verifying that a cell does not store a value in the guard band between a read threshold and a write threshold. In various embodiments, configuring or reconfiguring read thresholds may avoid errors that might otherwise occur as the stored value for a memory cell drifts over time. Similarly, in further embodiments, configuring or reconfiguring write thresholds may allow guard bands to shift with the read thresholds, or may change the size of guard bands (e.g., if larger guard bands become more useful as the non-volatile memory medium 122 ages)

In a further embodiment, a configuration parameter may refer to a another configurable or modifiable parameter, such as a threshold or parameter pertaining to a driver, a threshold or parameter pertaining to a hardware controller, such as an incremental step pulse programming parameter, or the like. In view of this disclosure, many types of configuration parameter are clear. The configuration parameter may be set once during initialization of the non-volatile memory media 122, dynamically with each command issued to the non-volatile memory media 122, or during operation of the non-volatile memory media 122 in response to triggers such as events or time intervals. The non-volatile memory controller 124, in one embodiment, proactively sets one or more configuration parameters for group or set of cells to improve the utility of the non-volatile memory media 122, to reduce errors, and the like.

Terms such as "initialize," "initial," and the like are used herein in contrast to terms such as "update," "updated," "adjusted," and the like, and are not intended to imply further limitations beyond that contrast. Thus, an "initial" configuration parameter refers to the value of the configuration parameter before determining or setting an updated or adjusted configuration parameter, and does not necessarily imply that the configuration parameter was undefined prior to setting or establishing the initial value. Thus, in various embodiments, the initialization module 402 may set, initialize, or establish an initial configuration parameter (e.g., a read voltage threshold or set of read voltage thresholds), by configuring or modifying the parameter by way of an interface. For example, in one embodiment, the initialization module 402 may use an interface to set initial configuration parameter values by storing the initial configuration parameter values in the configuration parameter registers 304 of FIG. 3. In one embodiment, the initial configuration parameter may be a single value, or set of values. In another embodiment, the initial configuration parameter may be a range, endpoints of a range, a midpoint of a range, or the like, and the update module 404 may update the initial configuration parameter by selecting an updated value for the configuration parameter from within the range.

In a certain embodiment, the initialization module 402 may overwrite a default value for the configuration parameter (e.g., a default value stored in a configuration parameter register 304, or the like) with a new initial value for the configuration parameter. As used herein, a "default" value for a configuration parameter may refer to a value set by a manufacturer or vendor. A default value for a configuration parameter may be set or determined by a manufacturer or vendor of a non-volatile memory element 123 at a time of manufacture, testing, or configuration of the non-volatile memory element 123, or, in certain embodiments, a default value may be determined or updated by a configuration tool 302, integrated update function, or the like provided by a manufacturer or vendor. In a further embodiment, the initialization module 402 may overwrite an updated value for the configuration parameter from the integrated update function (e.g., an updated initial value or a value that has been updated multiple times) in response to a trigger. For example, in one embodiment, a trigger may occur when a program/erase count threshold, a retention time threshold, an error threshold, or the like is satisfied, indicating that characteristics of a group of cells may have changed sufficiently to make a new configuration parameter value appropriate. In a further embodiment, the initialization module 402 may overwrite a previously updated configuration parameter value with a new initial configuration parameter value, and the update module 404 may use the configuration tool 302 or integrated update function to update the new initial value.

In one embodiment, the initialization module 402 may set an initial configuration parameter for a group of storage cells based on one or more characteristics for the group of storage cells. For example, in a further embodiment, the initialization module 402 may establish an initial read voltage threshold for an erase block based on one or more characteristics of the erase block. In a certain embodiment, the initialization module 402 may set an initial configuration parameter by initializing a set of multiple configuration parameters for the group of cells (e.g., three read voltage thresholds defining four states for MLC Flash memory cells, or the like). In various embodiments, setting one or more initial configuration parameters for a group of cells based on characteristics of that group may allow a configuration tool 302 to update the configuration parameters appropriately by searching in a narrow range around the initial configuration parameters.

A "characteristic" of a set or group of cells such as an erase block, as used herein, may refer to any attribute, statistic, or other descriptor associated with the set or group of cells. A characteristic for a group of storage cells may be substantially static or may be dynamic and change over time. A characteristic for a group of storage cells, in one embodiment, may describe more than one group of storage cells. For example, in certain embodiments, a characteristic for a group of storage cells may include or relate to the non-volatile memory element 123 (e.g., chip, die, plane, package, etc.) that includes the group of storage cells. In a further embodiment, the characteristic may include an identifier for the non-volatile memory element 123 that includes the group of storage cells, or may relate to the make, model, manufacturer, product version, or the like for the non-volatile memory element 123. In another embodiment, a characteristic for a group of storage cells describes an attribute or statistic particular to that group of storage cells, such as such as a program/erase cycle count for an erase block, a read count for an erase block or for pages in the block, an erase dwell time between a previous erase and a previous write for the block, a retention time since a previous write for the block, an error statistic for the block, an indicator of whether the block is partially or fully programmed, or the like. A characteristic, in a further embodiment, may include or relate to an environmental condition or a use of the non-volatile memory device 120 and/or of the non-volatile memory media 122, such as a temperature, a use case (e.g., a cache use case, an archival use case, a server use case, an enterprise use case, a consumer use case, etc.), or the like.

In various embodiments, certain characteristics may affect error rates in various ways. For example, in one embodiment, a program/erase cycle count may affect an error rate for a block of Flash memory as charge leakage increases due to wear. As another example, in another embodiment, a retention time may affect an error rate for a block of Flash memory as cells' stored voltages decrease over time. Different storage characteristics may affect error rates differently in different types of non-volatile memory media, such as Flash memory, resistive memory, and the like. In certain embodiments, using an initialization module 402 to set an initial configuration parameter based on one or more characteristics may allow the configuration module 150 to use configuration parameters that compensate for wear, stored voltages drifting over time, or other error-causing phenomena.

In one embodiment, the initialization module 402 may initialize a value for a configuration parameter for a set of cells based on a predetermined model for the set of cells. In a further embodiment, a predetermined model for a set of cells may include different configuration parameter values for different characteristics for the set of cells. For example, in one embodiment, the predetermined model may include a table or other data structure that stores different read voltage threshold values for groups of cells with different program/erase cycle counts, retention times, and/or other characteristics, and the initialization module 402 may initialize a configuration parameter for a set of cells by referring to the configuration parameter for that set of cells' characteristics in the predetermined model.

In certain embodiments, a model for a set of cells may be predetermined by modeling or characterizing sets of cells with similar characteristics. In one embodiment, a predetermined model may be based on a mathematical model of expected characteristics for a set of cells. In another embodiment, a predetermined model may be based on experimental characterization of a similar set of cells in a different non-volatile storage device. In view of this disclosure, many ways of creating a predetermined model for setting initial configuration parameters are clear. In certain embodiments, using a predetermined model to initialize configuration parameter values may result in configuration parameter values that could be improved, as the actual performance of a set of cells may differ from the predetermined model. However, in further embodiments, the initialization module 402 may use a predetermined model to initialize a configuration parameter value because the predetermined model provides a useful starting point for updating the configuration parameter.

The update module 404, in one embodiment, is configured to update or adjust a configuration parameter. In a further embodiment, the update module 404 may update or adjust an initial value for the configuration parameter that was set or initialized by the initialization module 402. For example, in a certain embodiment, the update module 404 may set or determine a read voltage threshold that was initialized by the initialization module 402.

In various embodiments, a means for updating a configuration parameter may include an update module 404, a configuration module 150, a configuration tool 302, a non-volatile memory controller 124, a non-volatile memory media controller 126, a device driver such as an SML 130, a processor 111, other logic hardware and/or other executable code stored on a computer readable storage medium.

Other embodiments may include similar or equivalent means for updating a configuration parameter.

In various embodiments, the update module 404 may update, set, determine, or adjust a configuration parameter, such as a read voltage threshold, by using an integrated update function, read voltage search function, or other existing function of the non-volatile memory medium 122, or by otherwise triggering a configuration tool 302 of the non-volatile memory medium 122. In various embodiments, the update module 404 may trigger the configuration tool 302 by sending a command to update the configuration parameter, enabling a mode that causes the configuration tool 302 to update the configuration parameter in response to a subsequent command, or the like.

In one embodiment, the update module 404 may update a configuration parameter for a group of storage cells using an integrated update function. As used herein, an "integrated update function" refers to a function or configuration tool configured to update one or more configuration parameters, which is integrated or co-located with the group of storage cells on a chip, die, die plane, package, integrated circuit, or other non-volatile memory element 123 of the non-volatile storage medium 122. For example, in one embodiment, the update module 404 may use a configuration tool 302 located on a particular non-volatile memory element 123 to update a configuration parameter for a group of cells on that non-volatile memory element 123. In a certain embodiment, the update module 404 may update the configuration parameter by using the configuration tool 302 or integrated update function to update a set of multiple configuration parameters for a group of cells (e.g., multiple read thresholds defining states for a group of cells). In a further embodiment, the integrated update function, configuration tool 302, or other existing function of the non-volatile memory medium 122 may store the updated or adjusted configuration parameter in a configuration parameter register 304 referenced by electrical circuits (e.g., integrated circuits) of the non-volatile memory medium 122 for accessing the group of cells.

In one embodiment, an integrated update function, read voltage search function, or other existing function of the non-volatile memory medium 122 may use the initialized value from the initialization module 404 to update or adjust the configuration parameter. For example, in a certain embodiment, the update module 404 may update a read voltage threshold, or other configuration parameter value, by searching for improved parameter values in a range associated with the initial read voltage threshold, or other parameter value. In various embodiments, a range associated with an initial parameter value may be a range that includes the initial parameter value, a range centered on the initial parameter value, a range that extends in one direction from the initial parameter value, or that is in any other way based on the initial parameter value. In a further embodiment, the update module 404 may improve the configuration parameter within a narrow range associated with the initialized value (e.g., a range other than the full range of possible configuration parameter values) by searching or sweeping over the narrow range. Although searching or sweeping within a narrow range generally risks finding a local solution, with the possibility of better configuration parameter values outside the narrow range, the combination of the initialization module 402 and the update module 404 increases the likelihood and/or the speed of finding an appropriate configuration parameter value, in some embodiments, because the initialization module 402 determines a rough initial value in the full range of possible values for the configuration parameter, so that the update module 404 may refine the rough initial value within a narrower range associated with the initial value.

In one embodiment, the update module 404 may update or adjust a configuration parameter in response to a trigger occurring. In a certain embodiment, the trigger may occur when a threshold is satisfied. For example, in one embodiment, an error rate threshold may be satisfied if an error rate exceeds a threshold error rate, and the satisfied threshold may trigger the update module 404 to update or adjust a configuration parameter to compensate for the high error rate. In another embodiment, the initialization module 402 may overwrite a previously updated value for the configuration parameter with a new initial value based on characteristics of a group of storage cells in response to a trigger occurring, and the update module 404 may update or adjust the new initial value. Thus, as characteristics change for groups of storage cells, the initialization module 402 may set a new rough initial value, that may be refined by the update module 404. Various types of triggers and thresholds are described further below with regard to the trigger module 502 of FIG. 5.

The access module 406, in one embodiment, is configured to access a group or set of storage cells, by using the updated or adjusted configuration parameter from the update module 404. For example, in a certain embodiment, the update module 404 may set or determine a read voltage threshold for an erase block or another region of the non-volatile storage medium 122, and the access module 406 may access the erase block or region using the read voltage threshold from the update module 404.

In various embodiments, a means for accessing storage cells may include an access module 406, a configuration module 150, a non-volatile memory controller 124, a non-volatile memory media controller 126, a device driver such as an SML 130, a processor 111, a read pipeline 241, a write pipeline 240, other logic hardware and/or other executable code stored on a computer readable storage medium. Other embodiments may include similar or equivalent means for accessing storage cells.

As used herein, "accessing" a group of storage cells may refer to reading, writing, programming, erasing, storage capacity recovery (e.g., grooming, garbage collection), or any other operation pertaining to data values stored by the group of storage cells. In various embodiments, an access module 406 may use an updated configuration parameter to access a group of storage cells in various ways. For example, in one embodiment, the updated configuration parameter may be a read threshold (e.g., a read voltage threshold, read resistivity threshold, or the like), and the access module 406 may sense whether cells in the group satisfy the read threshold, thus reading a data value from the cell. In another embodiment, the updated configuration parameter may be a program verify threshold, and the access module 406 may apply programming pulses to cells in the group until the program verify threshold is satisfied, thus writing a data value to the cells. In view of this disclosure, various ways of accessing groups of cells using various updated configuration parameters are clear.

In one embodiment, the access module 406 may access a group of cells using an updated configuration by storing the updated configuration parameter in a configuration parameter register 304 for the group of cells. In a further embodiment, the access module 406 may reference the configuration parameter register 304 to use the updated configuration parameter for accessing the group of storage cells.

Figure 5:
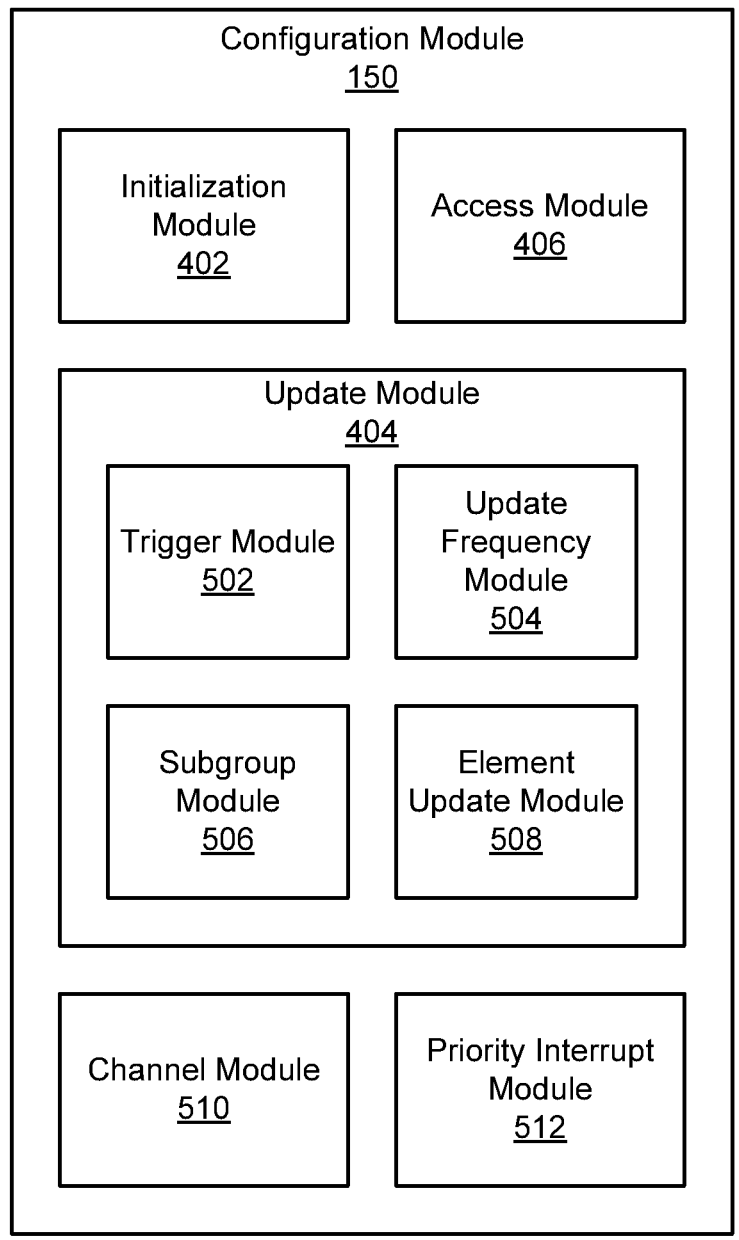
FIG. 5 is a schematic block diagram illustrating another embodiment of a configuration module.

FIG. 5 depicts another embodiment of a configuration module 150. The configuration module 150, in certain embodiments, may be substantially similar to the configuration module 150 described above with regard to FIG. 1, FIG. 2, and/or FIG. 4. In the depicted embodiment, the configuration module 150 includes an initialization module 402, an update module 404, and an access module 406, which may be configured substantially as described above with regard to FIG. 4. The update module 404, in the depicted embodiment, includes a trigger module 502, an update frequency module 504, a subgroup module 506, and an element update module 508. The configuration module 150, in the depicted embodiment, includes a channel module 510 and a priority interrupt module 512.

In one embodiment, the update module 404 updates or adjusts a configuration parameter in response to the trigger module 502 determining that a trigger has occurred. For example, in one embodiment, the trigger module 502 may determine that a trigger has occurred when a threshold is satisfied, and the update module 404 may trigger a configuration tool 302 for the non-volatile medium 122 in response to the threshold being satisfied. In another embodiment, the initialization module 402 may set an initial configuration parameter value (e.g., by overwriting a default or previously updated configuration parameter value) in response to the trigger module 502 determining that a trigger has occurred, so that the update module 404 may update the new initial configuration parameter value.

In one embodiment, the trigger module 502 may determine that a trigger has occurred when a threshold has been satisfied, and the term "trigger" may refer to the threshold. In another embodiment, the term "trigger" may refer to something other than a threshold being satisfied, that triggers the update module 404 to update or adjust a configuration parameter. In various embodiments, a threshold may be satisfied by the non-volatile memory device 120, the non-volatile memory medium 122, a non-volatile memory element 123, a region of the non-volatile memory medium such as an erase block, a pager, or another group or set of cells, or the like. For example, in one embodiment, an idle time threshold may be satisfied if the non-volatile memory device 120 is idle for a particular amount of time, suggesting that the update module 404 may update a configuration parameter without delaying a storage request. In another embodiment, however, an error threshold for an erase block may be satisfied if an error rate for that erase block is higher than a threshold value, suggesting that the update module 404 may reduce the error rate for that erase block by updating a configuration parameter.

In various embodiments a threshold may be satisfied based on a threshold value, so that the threshold is satisfied if a measured value exceeds, equals, or is less than the threshold value, depending on the threshold. For example, in one embodiment, an error threshold may be based on a percentage of bits in error, so that the threshold is satisfied if the percentage of bits in error is above the threshold value. In another embodiment, however, an error threshold may be based on a percentage of bits not in error, so that the threshold is satisfied if the percentage of bits not in error is below the threshold value. In one embodiment, a threshold value may be expressed directly, in absolute terms. For example, an idle time threshold may be satisfied by an idle time greater than one hour. In another embodiment, a threshold value may be expressed as a ratio, a percentage, or the like. For example, in a further embodiment, a program/erase cycle count threshold may be satisfied by a program/erase cycle count increasing by 1% of an expected maximum lifetime program/erase cycle count since the last update. In view of this disclosure, various ways of satisfying a threshold are clear.

In various embodiments, the trigger module 502 may determine that a trigger has occurred based on various types of thresholds, such as an idle time threshold, a program/erase cycle count threshold, an error threshold, a retention time threshold, or the like. For example, in one embodiment, the trigger module 502 may determine that a trigger has occurred based on an idle time satisfying an idle time threshold, a program/erase cycle count satisfying a program/erase cycle count threshold, a retention time satisfying a retention time threshold, an error statistic (e.g., a raw bit error rate, uncorrectable bit error rate, ratio of errors that change zeros to ones and errors that change ones to zeros, etc.) satisfying a corresponding threshold for that error statistic, or the like.

In certain embodiments, the trigger module 502 may use a trigger or threshold based on a characteristic that affects the error rate, or that otherwise suggests a reason for updating a configuration parameter. For example, in one embodiment, the trigger module 502 may trigger the update module 404 to update read voltage thresholds for Flash memory based on a retention time (e.g., the time since data was last written to a group or set of cells), because charge leakage is likely to increase with higher retention times, so updated read voltage thresholds may avoid errors. Similarly, in another embodiment the trigger module 502 may trigger the update module 404 to update read voltage thresholds for Flash memory based on a program/erase cycle count (e.g., the number of times a group or set of cells has been programmed and/or erased), because higher program/erase cycle counts are associated with increased rates of charge leakage due to wear, so updated read voltage thresholds may avoid errors. In view of this disclosure, many types of triggers and reasons for triggering the update module 404 to update a configuration parameter are clear.

In one embodiment, the update frequency module 504 is configured to manage a frequency for the update module 404 to adjust a configuration parameter (e.g., determine a read voltage threshold). In a certain embodiment, the update frequency module 504 may manage the frequency of configuration parameter updates for a region of the non-volatile memory medium 122, such as a group or set of storage cells, based on one or more characteristics of that region, group, or set.

In some embodiments, managing the frequency for configuration parameter updates for a group or set of cells based on a characteristic of that group or set may account for phenomena that change the appropriate configuration parameters for a group of cells faster or slower for groups of cells with different characteristics. For example, in one embodiment, a group of Flash memory cells may experience significant rates of charge leakage shortly after writing data to the cells (e.g., when retention times are low). In a further embodiment, the total amount of charge leakage may increase as retention time increases, but the rate of charge leakage may drop significantly. Thus, in a certain embodiment, the update frequency module 504 may schedule the update module 404 to update configuration parameters frequently for groups of cells with low retention times, and to update configuration parameters less frequently for groups of cells with high retention times. In another embodiment, a region of one non-volatile memory element 123 provide a longer time before significant error rates occur without updating a configuration parameter than a region of another non-volatile memory element 123, and the update frequency module 504 may manage the frequency of updates differently for groups of cells on different memory elements 123. In view of this disclosure, many characteristics are clear that the update frequency module 504 may use for managing the frequency of configuration parameter updates.

In one embodiment, the update frequency module 504 may manage the frequency for the update module 404 to update a configuration parameter by communicating with the trigger module 502 to determine a threshold or trigger for updating the configuration parameter. For example, in one embodiment, the update frequency module 504 may determine that the retention time for a group of cells is low, and may provide the trigger module 502 with frequent retention time triggers for updating read voltage thresholds for the group of cells. In another embodiment, the update frequency module 504 may determine that the retention time for a group of cells is high, and may provide the trigger module 502 with less frequent retention time triggers for updating read voltage thresholds for the group of cells. In view of this disclosure, many ways of managing update frequencies by communicating with a trigger module 502 are clear.

In one embodiment, the update module 404 may use the subgroup module 506 to update or determine a value for a configuration parameter based on one or more access characteristics of a subgroup or subset of a group or set of cells. In a further embodiment, the access module 406 may be configured to use the updated or determined configuration parameter to access the subset or subgroup of cells.

In various embodiments, a subgroup or subset of cells may be part of the group or set of cells for which the initialization module 402 determines an initial configuration parameter. For example, in one embodiment, the initialization module 402 may set an initial configuration parameter for an erase block, and the update module 404 may use the subgroup module 506 to update a configuration parameter for a subset of the erase block, such as a page, a word line, or the like.

An "access characteristic" for a subgroup, as used herein, refers to a characteristic that relates or refers to accessing the subgroup. In various embodiments, an access characteristic for a subgroup may include a retention time for the subgroup, a program/erase cycle count for the subgroup, a raw bit error rate (RBER), uncorrectable bit error rate (UBER) or other error statistic for the subgroup, or the like. In view of this disclosure, various types of access characteristics are clear.

In certain embodiments, access characteristics for a subgroup may be different from the corresponding characteristic for the group that contains the subgroup. For example, in one embodiment, pages may be written in an erase block at different times, so retention times for pages in the erase block may differ from the average retention time for the block. In another embodiment, block remapping for a logical erase block may retire one physical erase block and replace the retired block with a spare, so the new physical erase block may have a lower program/erase cycle count than the logical erase block. By updating a configuration parameter for a subgroup based on access characteristics of the subgroup, the subgroup module 506 may provide appropriate configuration parameters for different subgroups having different characteristics.

In one embodiment, the subgroup module 506 may maintain one configuration parameter value for a full group and another configuration parameter value for a subgroup. For example, in one embodiment, the subgroup module 506 may store an updated configuration parameter value for a group in a configuration parameter register 304, and may store another updated configuration parameter value for a subgroup in volatile memory. In a further embodiment, the subgroup module 506 may respond to a storage request for the subgroup by temporarily replacing the group configuration parameter value in the configuration parameter register 304 with the subgroup configuration parameter value, so that the access module 406 references the updated subgroup configuration parameter value to access the subgroup. In view of this disclosure, many ways of configuring an access module 406 to use an updated subgroup configuration parameter to access a subgroup, with or without using configuration parameter registers 304, are clear.

In another embodiment, the update module 404 and the subgroup module 506 may update a configuration parameter for a group based on access characteristics of a subgroup in response to the subgroup being accessed. In certain embodiments, updating group configuration parameters based on subgroup access characteristics in response to different subgroups being accessed may delay servicing storage requests for different subgroups in the group as configuration parameters are updated, but may avoid using additional memory to store subgroup configuration parameter values.

In one embodiment, the update module 404 may use the element update module 508 in conjunction with the channel module 510 to update a configuration parameter for one non-volatile memory element 123 in a channel, while sending another command to another non-volatile memory element 123 in the channel. In certain embodiments, a channel of non-volatile memory elements 123 (e.g., chips, dies, planes, packages, or the like) may comprise a plurality of memory elements 123, with one or more enable lines for memory elements in the channel coupled together in parallel.

In various embodiments, enable lines that may be coupled may include chip enable lines, write enable lines, read enable lines, output enable lines, or the like. In some embodiments, coupling enable lines in parallel for memory elements 123 in a channel allows the memory elements 123 in the channel to be used simultaneously. For example, in one embodiment, a logical page may include one physical page for each memory element 123 in a channel, and coupling write enable lines in parallel for the memory elements in the channel may allow data of the logical page to be written to the different physical pages simultaneously. However, although coupling enable lines for memory elements 123 in a channel may provide increased bandwidth for reading or writing to the channel, the increased bandwidth may be unused in some cases. For example, in one embodiment, a read request may be directed to a single physical page, on one memory element 123 in a channel, and other memory elements 123 in the channel may not transmit data for servicing that read request. In a further embodiment, other memory elements in the channel may respond to other commands, such as commands from the update module 404 for updating configuration parameters.

Thus, in one embodiment, the element update module 508 may be configured to send a command for updating or adjusting a configuration parameter to one memory element 123 in a channel. For example, in one embodiment, coupled enable lines for the memory elements 123 in the channel may be asserted so that the memory elements respond to commands, but command lines for memory elements 123 in the channel may be separate so that the element update module 508 can send a command for updating or adjusting a configuration parameter to one memory element 123 in the channel.

In a further embodiment, the channel module 510 may be configured to send a another command, not for adjusting the configuration parameter, to another memory element 123 in the channel, in parallel with the element update module 508 sending the first command, for updating the configuration parameter, to the first element 123. In various embodiments, a command not for adjusting the configuration parameter may be a program command, an erase command, a read command, a reset command, a "no-op" command that results in no operation being performed, or the like. Thus, in certain embodiments, the update module 404 may use the element update module 508 to send a first command for updating or adjusting a configuration parameter to a first memory element 123 in a channel, in parallel with the channel module 510 sending a second command, not for adjusting the configuration parameter, to a second memory element 123 in the channel. In various embodiments, sending different commands to different memory elements 123 in the same channel may allow the configuration module 150 to initialize or update a configuration parameter for one memory element 123 while using another memory element 123 in the channel for another purpose, or while not using another memory element 123 (e.g., sending a no-op command). In certain embodiments, updating configuration parameters for individual memory elements 123 in a channel may allow finer control of configuration parameters than would be achieved by updating configuration parameters simultaneously for multiple memory elements 123 in the channel.

The priority interrupt module 512, in one embodiment, is configured to interrupt the update module 404 adjusting or determining a configuration parameter, in response to an operation having a higher priority than adjusting or determining the configuration parameter. In various embodiments, various operations for a group or set of cells may have higher priorities than updating a configuration parameter, such as a read threshold. For example, in one embodiment, a read operation, write operation, program operation, or the like, may have a higher priority than updating a configuration parameter. In some embodiments, operation priorities may vary. For example, in one embodiment, a read operation for a group of cells may normally have a higher priority than an operation for updating read voltage thresholds, but the operation for updating read voltage thresholds may have a higher priority if a previous read operation for the group of cells resulted in uncorrectable errors (e.g., errors not correctable by an error correcting code for the group of cells).

In certain embodiments, the time used by the update module 404 for updating a configuration parameter may be substantially longer than the time normally used to service a storage request by performing a read operation, program operation, or the like. Thus, in various embodiments, the priority interrupt module 512 may avoid delaying higher priority storage requests or other options, by interrupting the update module 404 updating a configuration parameter. In some embodiments, if the priority interrupt module 512 interrupts a configuration parameter update in response to a higher priority operation, the higher priority operation may be completed with a non-updated configuration parameter, a default configuration parameter, or the like.

In one embodiment, the priority interrupt module 512 may return control to the update module 404 to resume updating a configuration parameter, in response to completion of the higher priority operation. For example, in one embodiment, the priority interrupt module 512 may interrupt an update to service a high-priority read operation, then allow the update module 404 to resume the update in response to completing the read operation. In another embodiment, however, the update module 404 may not resume the update. For example, in one embodiment, if the update module 404 is updating a configuration parameter for a group of cells based on a retention time threshold being satisfied, and the higher priority operation is an erase operation for the group of cells, the update module 404 may not resume updating the configuration parameter based on retention time, since the group of cells no longer retains the previously-stored data.

Figure 6A:
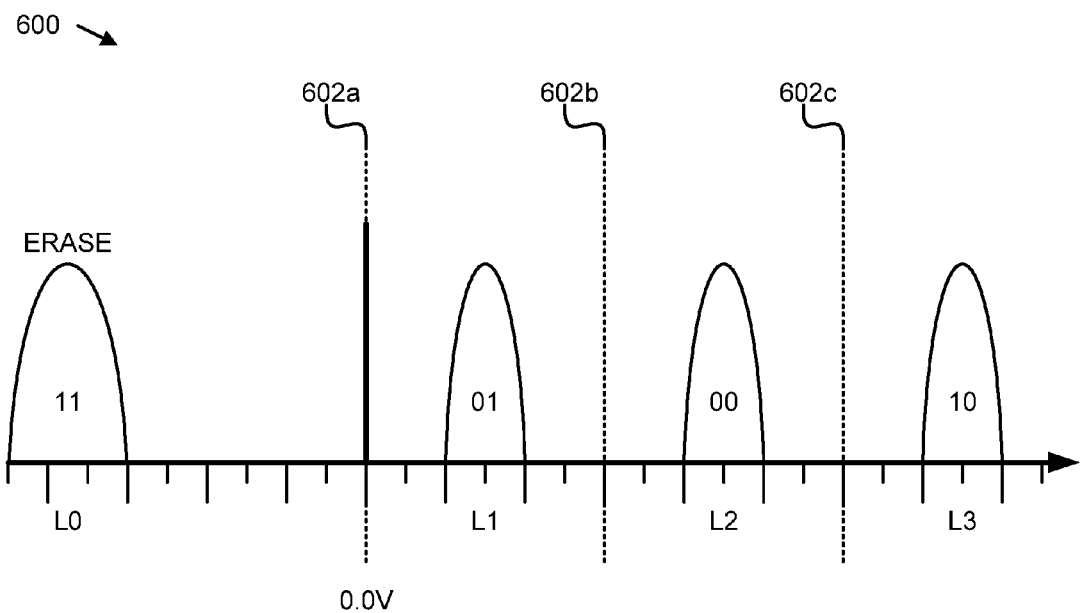
FIG. 6A is a graph illustrating one embodiment of configuration parameters for a non-volatile storage medium.

FIG. 6A depicts a graph 600 of a distribution of stored voltage values for cells of a non-volatile memory medium 122 using configuration parameters 602*a-c*. In the depicted embodiment, the non-volatile memory medium 122 is a multi-level cell (MLC) Flash memory medium in which each cell is a floating gate transistor with four states, but various types of memory and numbers of states per cell may be used in other embodiments. In the depicted embodiment, the data-encoding physical value of each cell is a voltage stored by the cell. Data is stored in each cell by changing the amount of stored charge in the floating gate, which determines the stored voltage for the cell and within which abode or state (e.g., the depicted L0, L1, L2, and L3 abodes) the stored voltage falls.

In the depicted embodiment, configuration parameters 602*a-c* are read thresholds (e.g., read voltage thresholds) that divide the range of possible stored voltage values for a cell into states L0, L1, L2, and L3, where L0 is the erased state. A read voltage corresponding to one of the read voltage thresholds 602*a-c* is applied to the control gate of the cell, and if the applied read voltage is sufficient to make the channel of the floating gate transistor conductive, the stored voltage for the cell is above the corresponding read voltage threshold 602*a-c*. If the stored voltage for a cell is below the first read threshold 602*a*, the cell is in the L0 state. If the stored voltage for a cell is above the first read threshold 602*a* but below the second read threshold 602*b*, the cell is in the L1 state, and so on. In some embodiments, the erased state L0 may correspond to a negative stored voltage.

In one embodiment, an encoding maps states onto data values. For example, in the depicted embodiment, a Gray code encoding maps the four states L0, L1, L2, and L3 to the data values "11," "01," "00," and "10," respectively, so that the cell stores two bits of information. Cells of non-volatile memory media may store data using many other encodings.

The graph 600 depicts the distribution of stored voltages for a set of cells, representing the number of cells storing each possible stored voltage occurring for the set of cells, a random selection from the set of cells, or the like. The graph 600 depicts an approximately uniform distribution among states L0-L3. In practice, the distribution of states for a set of cells may not be uniform. For example, if a long string of zeroes is written to a set of cells, more cells may be in the L2 state, which encodes "00" than in the other states. However, data compression or whitening algorithms may make the distribution of states substantially uniform over a large set of cells.

Although the distribution may be substantially uniform among states L0-L3, it is depicted as forming a peak in each state. In some embodiments, a cell may be programmed by issuing voltage pulses that move a stored voltage level for the cell to or near a target voltage in the middle of the range of voltages that defines the state. In a further embodiment, the target voltage for a state may be another configuration parameter for a block or non-volatile memory media 122. A peak may be centered on the target programming voltage, or the like. The width of the peaks may be affected by variations in the cells and the programming process, or by error-causing phenomena such as read disturbs, program disturbs, stress-induced leakage current, or the like. Although symmetric peaks are shown, skewed distributions and other distributions are possible. Over time, the distributions may widen or skew as the stored voltages move from their originally programmed values.

Figure 6B:
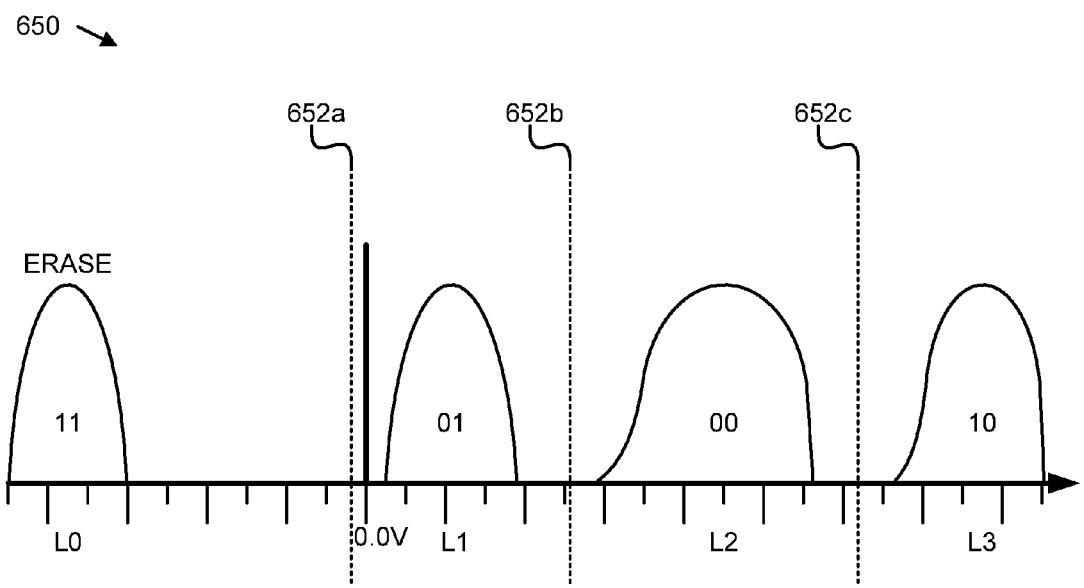
FIG. 6B is a graph illustrating another embodiment of configuration parameters for a non-volatile storage medium.

FIG. 6B depicts a graph 650 of another distribution of stored voltage values for the same set of cells as FIG. 6A, with adjusted configuration parameters 652a-c. The same states L0, L1, L2, and L3 encode the same data values data values "11," "01," 00," and "10," respectively, as described above. However, the peaks are wider in FIG. 6B than in FIG. 6A, and may be skewed. The widened and/or skewed peaks may be a result of error-causing phenomena such as read disturbs, program disturbs, stress-induced leakage current, or the like. As the peaks' shapes change with retention time, program/erase count, or other changes in storage characteristic, there is a substantial likelihood that a cell's stored voltage may cross one of the read thresholds 602 of Figure A, which would change that cell's state, resulting in an error, if the configuration module 150 did not manage configuration parameters by using adjusted read thresholds 652.

In certain embodiments, the configuration parameters 602a-c of FIG. 6A are default configuration parameters, set by a manufacturer, a vendor, or the like and the configuration module 150 may adjust or configure the default configuration parameters 602a-c to the adjusted configuration parameters 652a-c. In another embodiment, the adjusted configuration parameters 652a-c may be initialized configuration parameters 652a-c from the initialization module 402, and the update module 404 may further adjust configuration parameters 652a-c. The adjusted configuration parameters 652a-c more closely match the actual distributions of storage cell states of FIG. 6B than do the default configuration parameters 602a-c. Were a corresponding set of storage cells to use the default configuration parameters 602a-c with the distributions of storage cell states of FIG. 6B, the portions of the distributions that have drifted past the locations of the default configuration parameters 602a-c would register data errors. By configuring the corresponding set of storage cells to use the adjusted configuration parameters 652a-c, the configuration module 150 prevents, avoids, or corrects the potential data errors.

In one embodiment, as depicted in FIG. 6B, wider or skewed peaks may still be fairly far apart, so that course adjustments to configuration parameters 652a-c suffice. For example, in a certain embodiment, the initialization module 402 may set configuration parameters 652a-c, based on characteristics of a group of cells or based on a predetermined model, which may be imprecise, but which may nonetheless adequately separate the states L0-L3. However, in another embodiment, wider or skewed peaks may nearly overlap, or may actually overlap to some extent (error correcting codes may compensate for some number of errors due to overlapping peaks), in which case more errors may be avoided by more precisely updating configuration parameters 652a-c. Thus, in various embodiments, an initialization module 402 may set rough configuration parameter values, which may be more precisely updated by an update module 404 for use by an access module 406.

Figure 7:
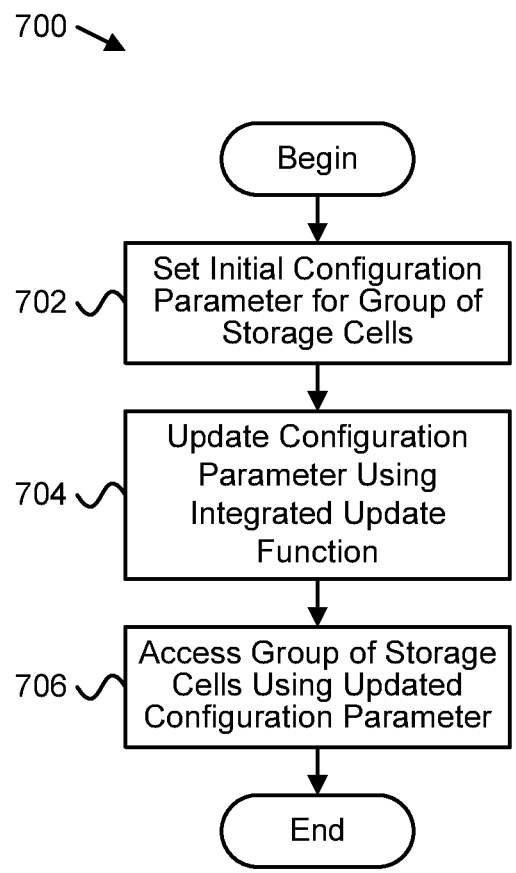
FIG. 7 is a schematic flow chart diagram illustrating one embodiment of a method for managing configuration parameters.

FIG. 7 depicts one embodiment of a method 700 for managing configuration parameters. The method 700 begins, and the initialization module 402 sets 702 an initial configuration parameter for a group of storage cells, based on one or more characteristics for the group of storage cells. The update module 404 updates 704 the configuration parameter using an integrated update function of the non-volatile storage medium 122. The access module 406 accesses 706 the group of storage cells using the updated configuration parameter, and the method 700 ends.

Figure 8:
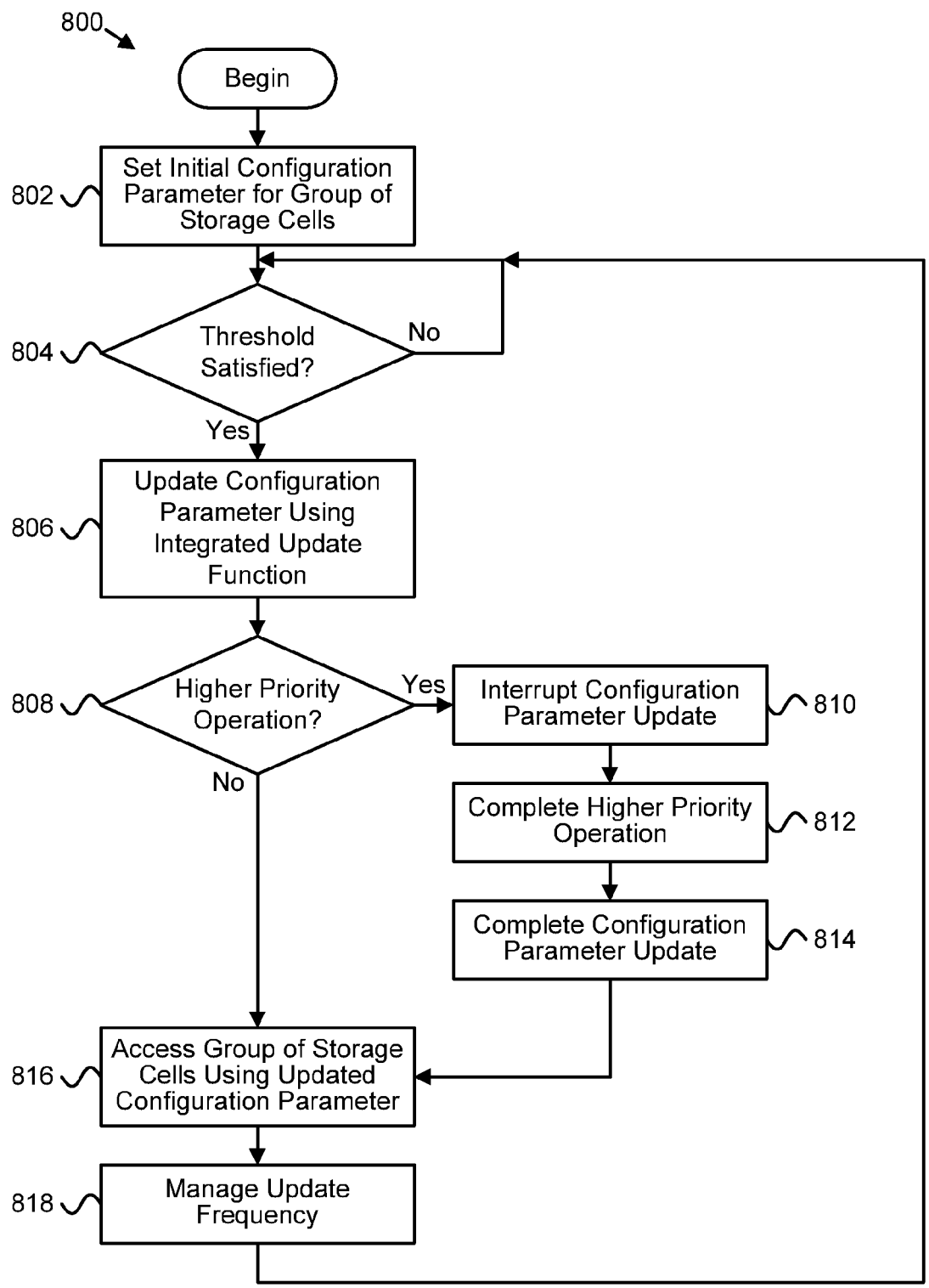
FIG. 8 is a schematic flow chart diagram illustrating a further embodiment of a method for managing configuration parameters.

FIG. 8 depicts another embodiment of a method 800 for managing configuration parameters. The method 800 begins, and the initialization module 402 sets 802 an initial configuration parameter for a group of storage cells, based on one or more characteristics for the group of storage cells. A trigger module 502 determines 804 whether a threshold for updating the configuration parameter is satisfied. If the threshold is not satisfied, the trigger module 502 continues to determine 804 whether the threshold is satisfied, and the method 800 continues. If the threshold is satisfied, the update module 404 updates 806 the configuration parameter using an integrated update function of the non-volatile storage medium 122.

The priority interrupt module 512 determines 808 whether an operation has a higher priority than the configuration parameter update. If an operation has a higher priority, the priority interrupt module 512 interrupts 810 the configuration parameter update. The non-volatile memory system 102 completes 812 the higher priority operation, and the update module 404 completes 814 the configuration parameter update. In response to the update module 404 completing 814 the interrupted update, or to the priority interrupt module 512 determining 808 that an operation does not have a higher priority than the configuration parameter update, the access module 406 accesses 816 the group of storage cells using the updated configuration parameter. The update frequency module 504 manages 818 the update frequency by determining at least one subsequent threshold for updating the configuration parameter. The trigger module 502 continues to determine 804 whether the subsequent threshold is satisfied, and the method 800 continues.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. A method comprising:
    overwriting a default value for an integrated update function of a non-volatile storage medium with an initial value for a configuration parameter for a group of storage cells of the non-volatile storage medium, the initial value based on one or more characteristics for the group of storage cells;
    updating the initial value for the configuration parameter using the integrated update function of the non-volatile storage medium; and
    accessing the group of storage cells using the updated value for the configuration parameter.

2. The method of claim 1, wherein a controller for the non-volatile storage medium overwrites the default value with the initial value for the configuration parameter, and initiates the integrated update function in response to a trigger.

3. The method of claim 1, wherein the integrated update function updates the initial value for the configuration parameter by searching within a range comprising the initial value for the configuration parameter.

4. The method of claim 1, further comprising overwriting an updated value for the configuration parameter from the integrated update function in response to a trigger.

5. The method of claim 1, wherein logic hardware for performing the integrated update function is co-located with the group of storage cells on a die of the non-volatile storage medium.

6. The method of claim 1, wherein updating the initial value for the configuration parameter comprises storing the updated value for the configuration parameter in a register referenced by circuits of the non-volatile storage medium for accessing the group of storage cells.

7. The method of claim 6, wherein overwriting the default value with the initial value for the configuration parameter comprises storing the initial value for the configuration parameter in the register.

8. The method of claim 1, wherein updating the initial value for the configuration parameter is in response to a threshold being satisfied, the threshold comprising one or more of an idle time threshold, a program/erase cycle count threshold, an error threshold, and a retention time threshold.

9. The method of claim 1, further comprising managing a frequency for updating values for the configuration parameter using the integrated update function, based on one or more characteristics for the group of storage cells.

10. The method of claim 1, further comprising interrupting the integrated update function in response to an operation for the group of storage cells having a higher priority than the integrated update function.

11. The method of claim 1, the method further comprising:
    sending a first command for initiating the integrated update function to a first memory element in a channel of non-volatile memory elements, wherein one or more enable lines for the memory elements in the channel are coupled together in parallel; and
    sending a second command that is not for the integrated update function to a second memory element in the channel in parallel with sending the first command to the first memory element.

12. An apparatus comprising:
    an initialization module configured to initialize a value for a configuration parameter for a set of cells of a non-volatile memory medium, based on a predetermined model for the set of cells;
    an update module configured to adjust the configuration parameter using an existing function of the non-volatile memory medium in response to a trigger, the existing function using the initialized value to adjust the configuration parameter; and
    an access module configured to access the set of storage cells using the adjusted configuration parameter.

13. The apparatus of claim 12, further comprising a controller for the non-volatile memory medium, the controller comprising at least the initialization module, the controller configured to provide the initialized value and to trigger the update module to adjust the configuration parameter, the existing function of the non-volatile memory medium using the initialized value to adjust the configuration parameter by searching within a range associated with the initialized value for the configuration parameter.

14. The apparatus of claim 12, wherein the initialization module is configured to initialize the configuration parameter by overwriting a previously determined value for the configuration parameter from the update module in response to a predefined trigger.

15. The apparatus of claim 12, wherein the trigger comprises one or more of an idle time threshold being satisfied, a program/erase cycle count threshold being satisfied, an error threshold being satisfied, and a retention time threshold being satisfied.

16. The apparatus of claim 12, further comprising an update frequency module configured to manage a frequency for the update module to adjust the configuration parameter, based one or more characteristics for the set of storage cells.

17. The apparatus of claim 12, further comprising a subgroup module configured to determine a value for the configuration parameter based on one or more access characteristics of a subset of the set of storage cells, wherein the access module is configured to use the determined configuration parameter to access the subset.

18. A system comprising:
    a non-volatile recording device comprising a non-volatile recording medium; and
    a controller for the non-volatile recording device, the controller
        establishing an initial read voltage threshold for an erase block of the non-volatile recording medium, based on one or more characteristics for the same erase block,
        setting the read voltage threshold by triggering a configuration tool of the non-volatile recording medium in response to a threshold being satisfied, and
        accessing the erase block using the set read voltage threshold.

19. The system of claim 18, wherein the controller sets the read voltage threshold by searching within a range associated with the initial read voltage threshold.

20. The system of claim 18, wherein the controller comprises one or more of a hardware controller for the non-volatile recording device and a device driver for the non-volatile recording device, the device driver comprising computer executable code stored on a non-volatile computer readable storage medium.

21. An apparatus comprising:
    a trigger module configured to determine that a trigger has occurred for a region of a non-volatile storage medium;
    an update module configured to determine a read voltage threshold using a read voltage search function of the non-volatile storage medium in response to the trigger; and
    an access module configured to access the region of the non-volatile storage medium using the determined read voltage threshold.

22. The apparatus of claim 21, further comprising an update frequency module configured to manage a frequency for the update module to determine the read voltage threshold, based one or more characteristics for the region of the non-volatile storage medium.

23. The apparatus of claim 21, further comprising a priority interrupt module configured to interrupt the update module determining the read voltage threshold in response to an operation having a higher priority than determining the read voltage threshold.

* * * * *